(12) United States Patent
Hsu et al.

(10) Patent No.: US 11,979,977 B2
(45) Date of Patent: May 7, 2024

(54) CIRCUIT BOARD WITH HEAT DISSIPATION STRUCTURE AND METHOD FOR MANUFACTURING SAME

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Hsiao-Ting Hsu, New Taipei (TW); Tao-Ming Liao, Tayuan (TW); Ming-Jaan Ho, New Taipei (TW); Xian-Qin Hu, Shenzhen (CN); Fu-Yun Shen, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 748 days.

(21) Appl. No.: 16/978,842

(22) PCT Filed: Aug. 31, 2019

(86) PCT No.: PCT/CN2019/103901
§ 371 (c)(1),
(2) Date: Sep. 8, 2020

(87) PCT Pub. No.: WO2021/035762
PCT Pub. Date: Mar. 4, 2021

(65) Prior Publication Data
US 2023/0112890 A1    Apr. 13, 2023

(51) Int. Cl.
*H05K 1/02* (2006.01)
*H05K 3/42* (2006.01)
(Continued)

(52) U.S. Cl.
CPC ......... *H05K 1/0207* (2013.01); *H05K 1/0206* (2013.01); *H05K 3/423* (2013.01);
(Continued)

(58) Field of Classification Search
None
See application file for complete search history.

(56) References Cited

U.S. PATENT DOCUMENTS

2008/0087456 A1* 4/2008 Schuette ............... H05K 3/4641
29/829
2016/0143132 A1* 5/2016 Min ..................... H05K 1/0272
361/699
(Continued)

*Primary Examiner* — Ishwarbhai B Patel
(74) *Attorney, Agent, or Firm* — ScienBiziP, P.C.

(57) ABSTRACT

A method for manufacturing a circuit board including: providing at least one wiring base board, the wiring base board comprising a first conductor layer, an insulation layer, and an alloy layer which are stacked in order, wherein a solder paste layer is formed on a side of the alloy layer, a part of the alloy layer is exposed out of the solder paste layer to form a thermal conductive surface; providing a core layer; and pressing two wiring base boards on two opposite sides of the core layer to form a sealed heat dissipating chamber between the thermal conductive surfaces of the two wiring base boards. The present disclosure further provides a circuit board having a heat dissipation structure.

14 Claims, 8 Drawing Sheets

(51) Int. Cl.
  *H05K 3/46* (2006.01)
  *H05K 1/11* (2006.01)
  *H05K 1/14* (2006.01)

(52) U.S. Cl.
  CPC ......... *H05K 3/4641* (2013.01); *H05K 1/0203* (2013.01); *H05K 1/0272* (2013.01); *H05K 1/11* (2013.01); *H05K 1/14* (2013.01)

(56) References Cited

U.S. PATENT DOCUMENTS

2017/0167799 A1* 6/2017 Silvano De Sousa ........................ H05K 7/20336
2019/0059174 A1* 2/2019 Hu ........................... G06F 1/203

* cited by examiner

CIRCUIT BOARD WITH HEAT DISSIPATION STRUCTURE AND METHOD FOR MANUFACTURING SAME

FIELD

The subject matter herein generally relates to circuit boards, especially to a circuit board having a heat dissipation structure and a method for manufacturing the same.

BACKGROUND

A printed circuit board supports electronic components, and is an electrical connection carrier of the electronic components. High-power components such as power devices or laser devices disposed on the printed circuit board will generate a lot of heat, which can cause local overheating of the printed circuit board. To resolve the above problem, in the related art, a heat pipe is embedded in the printed circuit board as a heat dissipation structure of the circuit board. However, the heat pipe may readily collapse, and manufacturing processes of embedding the heat pipe in the printed circuit board are complicated.

SUMMARY

What is needed is a method for manufacturing a circuit board in which a heat dissipation structure does not readily collapse, a production process of the circuit board being simplified.

What is also needed, is a circuit board in which a heat dissipation structure does not readily collapse.

A method for manufacturing a circuit board includes steps of:
  providing two wiring base boards, each of the wiring base boards including a first conductor layer, an insulation layer, and an alloy layer stacked in order, wherein a solder paste layer is formed on a side of the alloy layer, a part of the alloy layer is exposed out of the solder paste layer to form a thermal conductive surface, and the solder paste layer is disposed around the thermal conductive surface:
  providing a core layer; and
  pressing the two wiring base boards on two opposite sides of the core layer, the solder paste layers of the two wiring base boards being connected to each other, the solder paste layers and the thermal conductive surfaces of the two wiring base boards together forming a sealed heat dissipating chamber, the heat dissipating chamber being provided with a heat transfer medium therein, thereby obtaining the circuit board, wherein the insulation layer is provided with a first thermal conductive element connecting the first conductor layer and the alloy layer, the first conductor layer, the first thermal conductive element, the alloy layer, and the heat dissipating chamber together form a heat transfer path.

A circuit board includes:
  two wiring base boards, each of the two wiring base board comprising a first conductor layer, an insulation layer, and an alloy layer stacked in order;
  a solder paste layer disposed between the alloy layers of the two wiring base boards, wherein a part of the alloy layer is exposed out of the solder paste layer to form a thermal conductive surface, a sealed heat dissipating chamber being formed between two thermal conductive surfaces on two alloy layers of the two wiring base boards: and
  a heat transfer medium located in the heat dissipating chamber, wherein the insulation layer is provided with a first thermal conductive element connecting the first conductor layer and the alloy layer, the first conductor layer, the first thermal conductive element, the alloy layer, and the heat dissipating chamber together form a heat transfer path.

The heat dissipation structure in the circuit board does not readily collapse, so that the heat dissipation effect can be ensured. An efficiency of heat dissipation from the circuit board is improved. In the method, the embedded heat dissipation structure and circuit board are formed at the same time, which simplifies the manufacturing process. The insulation layer is provided with the first thermal conductive element connecting the first conductor layer and the alloy layer, the second conductor layer is provided with a solder paste layer, the solder paste layer electrically connects two conductor layers and seals the heat dissipating chamber.

BRIEF DESCRIPTION OF THE DRAWINGS

Implementations of the present technology are described by way of embodiments with reference to the attached figures.

SYMBOLS FOR MAIN ELEMENTS

Figure 1:
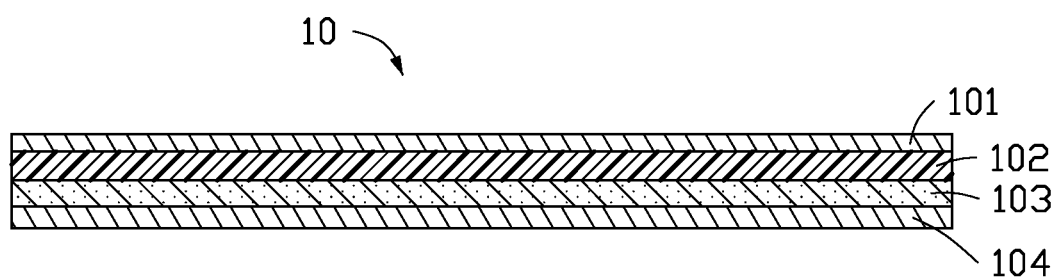
FIG. 1 is a cross-sectional view of an embodiment of a copper clad laminate.

Circuit board 100, 200;
Copper clad laminate 10;
First copper foil layer 101;
Insulation layer 102;
Alloy layer 103;
Second copper foil layer 104;
First thermal conductive element 11;
First conductor layer 20;
Second conductor layer 21;
Wiring base board 30;
Core layer 31;
Solder paste layer 32;
Heat dissipating chamber 33;
Polytetrafluoroethylene 34;
Thermal conductive surface 40;
Second thermal conductive element 41;
Solder mask layer 50.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. When a first component is referred to as "disposed to" a second component, it is intended that the first component may be directly mounted to the second component or may be indirectly mounted to a second component via a third component between them.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Implementations of the disclosure will now be described, by way of embodiments only, with reference to the drawings. It should be noted that non-conflicting details and features in the embodiments of the present disclosure may be combined with each other.

One embodiment of a method for manufacturing a circuit board includes the following steps.

Step S11, referring to FIG. 1, a copper clad laminate 10 is provided.

The copper clad laminate 10 includes, stacked in this order, a first copper foil layer 101, an insulation layer 102, an alloy layer 103, and a second copper clad foil layer 104.

The insulation layer 102 may be made of a material selected from epoxy resin, polypropylene, bismaleimide triazine resin, polyphenylene oxide, polypropylene, polyimide, polyethylene terephthalate, polyethylene naphthalate, and any combination thereof. In one embodiment, the insulation layer 102 is made of polypropylene. The alloy layer 103 is one or more of a nickel-chromium alloy layer, a copper-chromium alloy layer, and a copper-aluminum alloy layer. In one embodiment, the alloy layer 103 is a nickel-chromium alloy layer.

Figure 2:
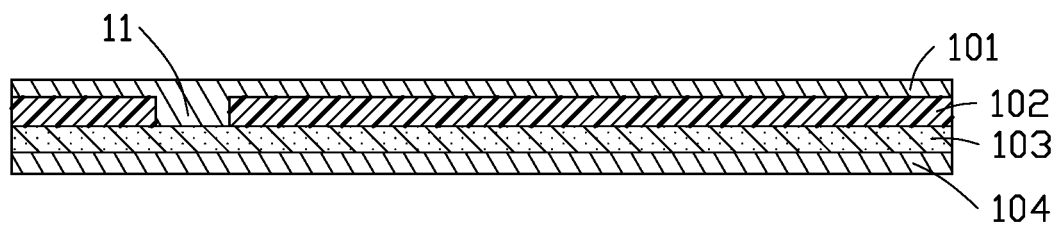
FIG. 2 is a cross-sectional view showing a first thermal conductive element formed on an insulation layer of the copper clad laminate of FIG. 1.

Step S12, referring to FIG. 2, a first thermal conductive element 11 is formed in the insulation layer 102.

Specifically, the insulation layer 102 defines a through hole (not shown) which passes through two opposite surfaces of the insulation layer 102, the interior of the through hole is electroplated with copper to form the first thermal conductive element 11. The first thermal conductive element 11 electrically connects the first copper foil layer 101, the alloy layer 103, and the second copper foil layer 104.

Figure 3:
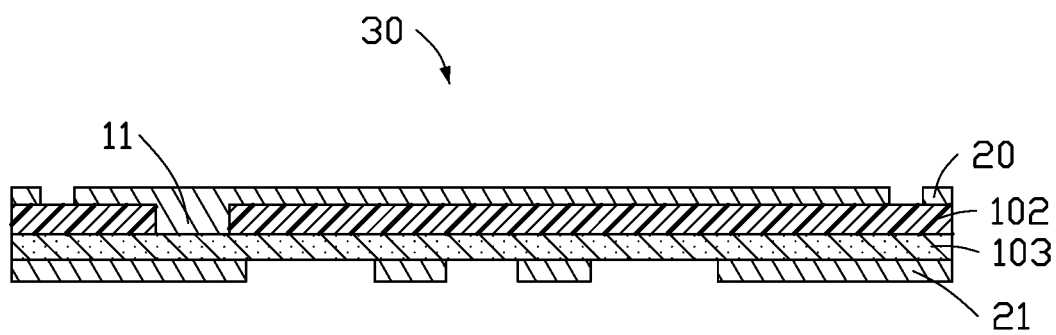
FIG. 3 is a cross-sectional view showing a first conductor layer and a second conductor layer formed by etching a first copper foil layer and a second copper foil layer shown in FIG. 2.

Step S13, referring to FIG. 3, the first copper foil layer 101 is etched to form a first conductor layer 20.

The first conductor layer 20 is formed by performing an exposure and development process on the first copper foil layer 101.

Step S14, the second copper foil layer 104 is etched to for a second conductor layer 21, thereby obtaining a first wiring base board 30.

The second conductor layer 21 is formed by performing an exposure and development process on the second copper foil layer 104. The second conductor layer 21 is electrically connected to the alloy layer 103 and is electrically connected to the first conductor layer 20 through the alloy layer 103 and the first thermal conductive element 11.

Figure 4:
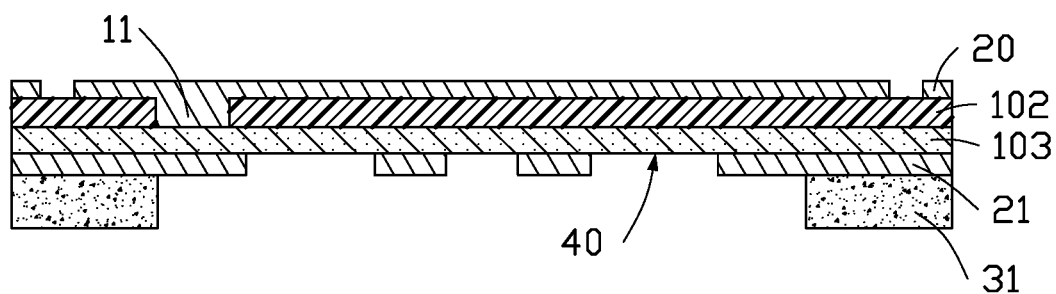
FIG. 4 is a cross-sectional view showing a core layer pressed on a wiring base board shown in FIG. 3.
Figure 5:
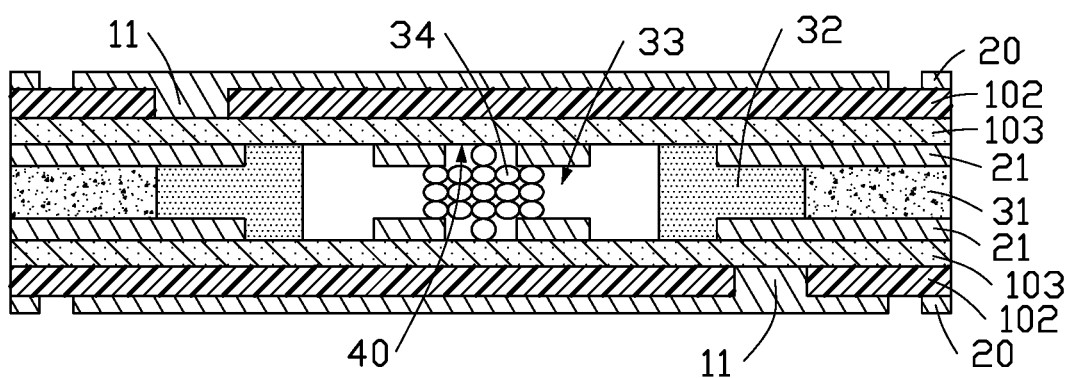
FIG. 5 is a cross-sectional view showing a polytetrafluoroethylene and a heat transfer medium infilling a structure stacked by two of the wiring base boards of FIG. 3.

Step S15, referring to FIG. 4 and FIG. 5, a solder paste layer 32 is formed on at least one side of the alloy layer 103 of the wiring base board 30, and a part of the alloy layer 103 is exposed out of the solder paste layer 32 to form a thermal conductive surface 40.

In some embodiments, the solder paste layer 32 is further formed on the second conductor layer 21.

Step S16, a core layer 31 is provided.

The core layer 31 may be made of an adhesive material.

Step S17, two of the wiring base boards 30 are pressed on two opposite sides of the core layer 31, and the solder paste layers 32 of the two wiring base boards 30 are connected to each other, thereby forming a sealed heat dissipating chamber 33 between the thermal conductive surfaces 40 of the two wiring base boards 30.

The solder paste layers 32 and the thermal conductive surfaces 40 together form the heat dissipating chamber 33. The solder paste layers 32 electrically connect the two second conductor layers 21 and are configured to seal the heat dissipating chamber 33. The core layer 31 is disposed around the solder paste layers 32. A part of the second conductor layer 21 on the thermal conductive surface 40 is exposed outside the solder paste layers 32 and is located in the heat dissipating chamber 33. A position of the first thermal conductive element 11 in the insulation layer 102 may be changed as needed. In some embodiments, the first thermal conductive element 11 is located on a side of the heat dissipating chamber 33. That is, an axis of the first thermal conductive element 11 passes through the heat dissipating chamber 33.

Step S18, a heat transfer medium and polytetrafluoroethylene 34 infill the heat dissipating chamber 33.

Specifically, before infilling the heat transfer medium, the heat dissipating chamber 33 is evacuated. In one embodiment, the heat transfer medium is water. The polytetrafluoroethylene 34 prevents the heat dissipating chamber 33 from collapsing. The first conductor layer 20 on each wiring base board 30, the first thermal conductive element 11 on each wiring base board 30, the alloy layer 103 on each wiring base board 30, and the heat dissipating chamber 33 together form a heat transfer path. The first thermal conductive element 11 has a heat transfer function and can transmit out the heat in the heat dissipating chamber 33. Both of the heat transfer medium and the polytetrafluoroethylene 34 can be infilled before the two wiring base boards 30 and the core layer 31 are pressed together or can be infilled after the two wiring base boards 30 and the core layer 31 are pressed together. The first conductor layers 20, the first thermal conductive elements 11, the alloy layers 103, the heat dissipating chamber 33, and the heat transfer medium together form a heat dissipation structure. In use, the heat transfer medium (eg, water) in the heat dissipating chamber 33 absorbs the heat of one of the alloy layers 103 transmitted from one first thermal conductive element 11, and then transfers the absorbed heat to the other alloy layer 103, the heat is then transmitted to the external environment through the other thermal conductive element 11, thereby achieving the heat dissipation.

Figure 6:
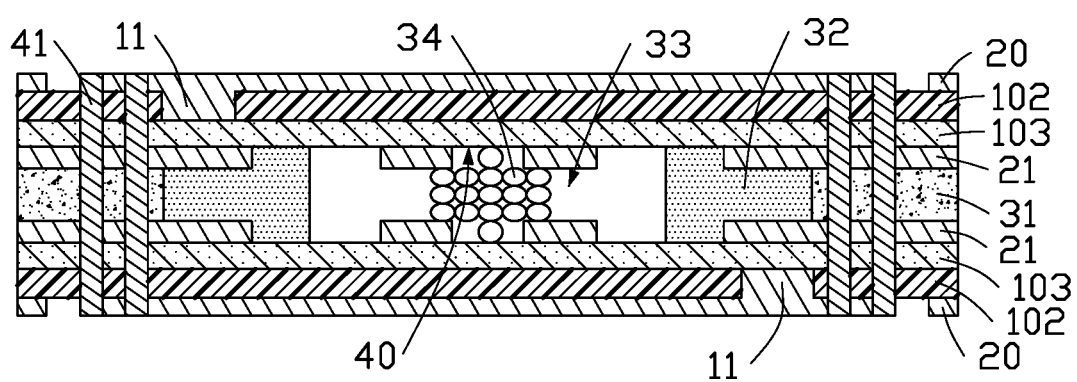
FIG. 6 is a cross-sectional view showing a second thermal conductive element formed on the wiring base board and the core layer shown in FIG. 5.

Step S19, referring to FIG. 6, at least one second thermal conductive element 41 is formed between two first conductor layers 20.

Each second thermal conductive element 41 passes through each alloy layer 103, each second conductor layer 21, and the core layer 31. In one embodiment, first, a through hole is defined, passing through the alloy layers 103, the second conductor layers 21, the core layer 31, and the first conductor layers 20, and then the interior of through hole is electroplated with copper to form the second thermal conductive element 41. The second thermal conductive element 41 is configured to form the other heat transfer path to transmit heat of the second conductor layers 21 to the external environment.

Figure 7:
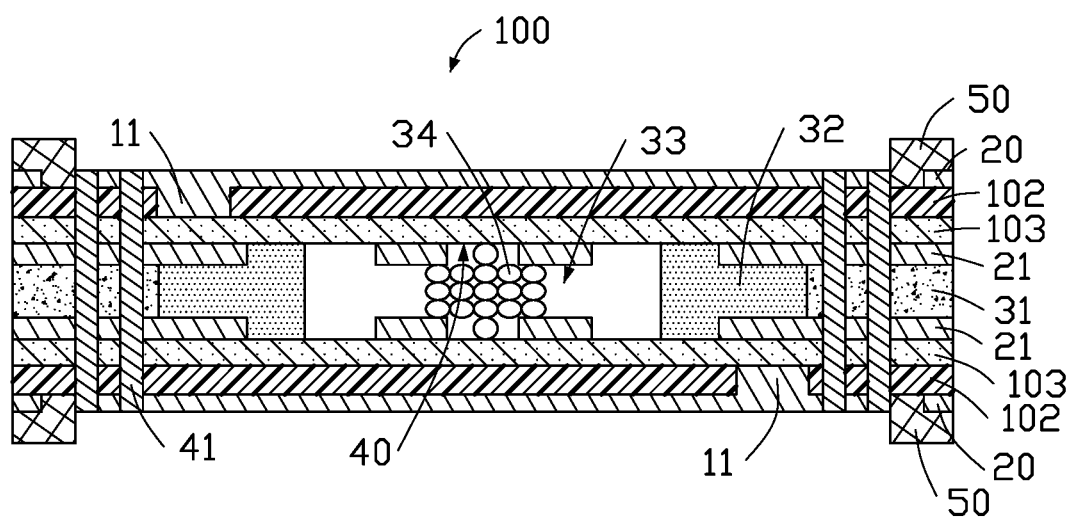
FIG. 7 is a cross-sectional view showing a solder mask layer formed on the first conductor layer shown in FIG. 5.

Step S20, referring to FIG. 7, a solder mask layer 50 is formed on a surface of each first conductor layer 20 and is located on a side of the corresponding second thermal conductive element 41 away from the heat dissipating chamber 33, thereby obtaining the circuit board 100.

The solder mask layer 50 is configured to protect the corresponding first conductor layer 20. A material of the solder mask layer 50 may be a solder resist ink, such as green oil.

Referring to FIG. 7, the present disclosure further provides a circuit board 100, the circuit board 100 includes two wiring base boards 30, each wiring base board 30 includes a first conductor layer 20, an insulation layer 102, and an alloy layer 103 which are stacked in that order.

The insulation layer 102 is provided with a first thermal conductive element 11 electrically connecting the first conductor layer 20 and the alloy layer 130, the first thermal conductive element 11 passes through the insulation layer 102. The insulation layer 102 may be made of a material selected from epoxy resin, polypropylene, bismaleimide triazine resin, polyphenylene oxide, polypropylene, polyimide, polyethylene terephthalate, polyethylene naphthalate, and any combination thereof. In one embodiment, the insulation layer 102 is made of polypropylene.

The alloy layer 103 is at least one of a nickel-chromium alloy layer, a copper-chromium alloy layer, and a copper-aluminum alloy layer. In one embodiment, the alloy layer 103 is a nickel-chromium alloy layer.

The circuit board 100 further includes a core layer 31, the core layer is sandwiched between the alloy layers 103 of the two wiring base boards 30. The core layer 31 may be made of an adhesive material.

Each wiring base board 30 further includes a second conductor layer 21, the second conductor layer 21 is disposed on a side of the corresponding alloy layer 103 away from the insulation layer 102. The core layer 31 is disposed on the second conductor layer 21.

The circuit board 100 further includes a solder paste layer 32, the solder paste layer 32 is formed on the second conductor layer 21. The core layer 31 is disposed around the solder paste layer 32. A part of the alloy layer 103 is exposed out of the solder paste layer 32 to form a thermal conductive surface 40, a sealed heat dissipating chamber 33 is formed between the two thermal conductive surfaces 40. A part of the second conductor layer 21 on the thermal conductive surface 40 is exposed outside the solder paste layers 32 and is located in the heat dissipating chamber 33. The solder paste layers 32 and the thermal conductive surfaces 40 together form the heat dissipating chamber 33. The solder paste layer 32 electrically connects the two second conductor layers 21 and transmits out heat in the heat dissipating chamber 33.

The circuit board 100 further includes a heat transfer medium, the heat transfer medium is located in the heat dissipating chamber 33. In one embodiment, the heat transfer medium is water. The first conductor layer 20 on each wiring base board 30, the first thermal conductive element 11 on each wiring base board 30, the alloy layer 103 on each wiring base board 30, and the heat dissipating chamber 33 together form a heat transfer path. The heat dissipating chamber 33 is provided with polytetrafluoroethylene 34 therein. The polytetrafluoroethylene 34 prevents the heat dissipating chamber 33 from collapsing. The first conductor layers 20, the first thermal conductive elements 11, the alloy layers 103, the heat dissipating chamber 33, and the heat transfer medium together form a heat dissipation structure. A position of the first thermal conductive element 11 in the insulation layer 102 may be changed as needed. In some embodiments, the first thermal conductive element 11 is located on a side of the heat dissipating chamber 33. That is, an axis of the first thermal conductive element 11 passes through the heat dissipating chamber 33.

In use, the heat transfer medium (eg, water) in the heat dissipating chamber 33 absorbs the heat of one of the alloy layers 103 transmitted from a corresponding one first thermal conductive element 11 and then transfers the absorbed heat to the other alloy layer 103, the heat is then transmitted to the external environment through the other thermal conductive element 11, thereby achieving the heat dissipation.

Each alloy layer 103 has strength and rigidity, thus the collapse of the heat dissipating chamber 33 can be prevented. The alloy layer 103 is used as a contact layer of the heat source, which prevents the generation of bubbles during the embedding process and maintains the sealing of the heat dissipating chamber 33, and also prevents the generation of copper oxide (Cut)). The alloy layer 103 is harder than pure copper, which is beneficial for reducing a thickness of the alloy layer 103, thereby improving the heat dissipation ability. When the thickness of the alloy layer 103 is greater than 0.1 mm, the polytetrafluoroethylene 34 may be omitted, and the surface of the alloy layer 103 can be passivated.

The circuit board 100 further includes at least one second thermal conductive element 41, each second thermal conductive element 41 passes through each alloy layer 103, each second conductor layer 21, and the core layer 31. Each second thermal conductive element 41 is coated with copper. The second thermal conductive element 41 is configured to transmit heat generated by the second conductor layer 21 to the external environment. In one embodiment, the circuit board 200 includes four second thermal conductive elements 41. Specifically, two second thermal conductive elements 41 are located on a side of the heat dissipating chamber 33, the other two second transfer elements 41 are located on the other side of the heat dissipating chamber 33.

The circuit board 100 further includes two solder mask layers 50. Each solder mask layer 50 is disposed on a surface of a first conductor layer 20. The solder mask layers 50 are located on sides of the second thermal conductive element 41 away from the heat dissipating chamber 33, the solder mask layers 50 are configured to protect the first conductor layers 20. A material of the solder mask layer 50 may be a solder resist ink, such as green oil.

Figure 8:
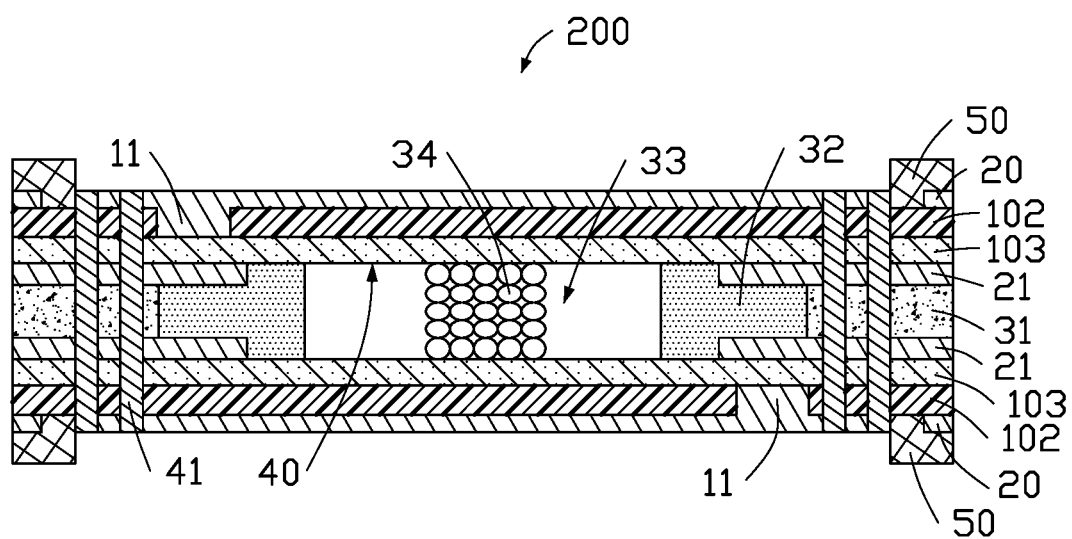
FIG. 8 is a cross-sectional view of an embodiment of a circuit board.

Referring to FIG. 8, another embodiment of the present disclosure further provides a circuit board 200. The difference between the circuit board 200 and the circuit board 100 is that the second conductor layer 21 of the circuit board 200 is completely covered by the core layer 31 and the solder paste layer 32, that is, the second conductor layer 21 is not provided in the heat dissipating chamber 33.

The present disclosure has the following advantages:

First, the alloy layer 103 solves the sealing problem of the heat dissipating chamber 33 and is effective in transmitting the heat of the heat dissipating chamber 33 out through the heat transfer medium, the alloy layer 103, and the first thermal conductive element 11 to the external environment; the alloy layer 103 is a nickel-chromium alloy layer, the nickel-chromium alloy layer has a high mechanical strength, which reinforces the strength of the heat dissipating chamber 33, thereby overcoming the problem of the collapse of the heat dissipating chamber 33.

Second, in this application, the polytetrafluoroethylene 34 is infilled in the heat dissipating chamber 33, preventing the heat dissipating chamber 33 from collapsing.

Third, in this application, the heat dissipation structure is manufactured simultaneously during the manufacturing process of the circuit board 100, simplifying the manufacturing process and improving the yield of the product.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a circuit board with a heat dissipation structure, comprising:
    providing two wiring base boards, each of the wiring base boards comprising a first conductor layer, an insulation layer, and an alloy layer stacked in order, wherein a solder paste layer is formed on a side of the alloy layer, a part of the alloy layer is exposed out of the solder paste layer to form a thermal conductive surface, and the solder paste layer is disposed around the thermal conductive surface;
    providing a core layer; and
    pressing the two wiring base boards on two opposite sides of the core layer, the solder paste layers of the two wiring base boards being connected to each other, the solder paste layers and the thermal conductive surfaces of the two wiring base boards together forming a sealed heat dissipating chamber, the heat dissipating chamber being provided with a heat transfer medium therein, thereby obtaining the circuit board, wherein the insulation layer is provided with a first thermal conductive element connecting the first conductor layer and the alloy layer, the first conductor layer, the first thermal conductive element, the alloy layer, and the heat dissipating chamber together form a heat transfer path.

2. The method for manufacturing a circuit board of claim 1, wherein the alloy layer is one or more of a nickel-chromium alloy layer, a copper-chromium alloy layer, and a copper-aluminum alloy layer.

3. The method for manufacturing a circuit board of claim 1, wherein pressing two wiring base boards on two opposite sides of the core layer comprises infilling the heat dissipating chamber with polytetrafluoroethylene.

4. The method for manufacturing a circuit board of claim 1, wherein a method for manufacturing each of the two wiring base boards comprises:
    providing a copper clad laminate, the copper clad laminate comprising a first copper foil layer, the insulation layer, and the alloy layer stacked in order;
    defining a through hole on the insulation layer, the through hole passing through the insulation layer;
    electroplating an interior of the through hole with copper to form the first thermal conductive element; and
    etching the first copper layer to form the first conductor layer.

5. The method for manufacturing a circuit board of claim 4, wherein the copper clad laminate further comprises a second copper foil layer formed on a side of the alloy layer away from the insulation layer, the method for manufacturing each of the two wiring base boards further comprises etching the second copper foil layer to form a second conductor layer, wherein the solder paste layer is further formed on the second conductor layer.

6. The method for manufacturing a circuit board of claim 5, wherein the core layer is disposed around the solder paste layer, the solder paste layer electrically connects two second conductor layers of the two wiring base boards, the solder paste layer and two thermal conductive surfaces on two alloy layers of the two wiring base boards together form the heat dissipating chamber.

7. The method for manufacturing a circuit board of claim 5, further comprising forming at least one second thermal conductive element between two first conductor layers of the two wiring base boards, the at least one second thermal conductive element passing through two alloy layers of the two wiring base boards, two second conductor layer of the two wiring base boards, and the core layer.

8. The method for manufacturing a circuit board of claim 1, further comprising forming a solder mask layer on a surface of the first conductor layer of each of the two wiring base boards.

9. A circuit board comprising:
    two wiring base boards, each of the two wiring base boards comprising a first conductor layer, an insulation layer, and an alloy layer stacked in order;
    a solder paste layer disposed between the alloy layers of the two wiring base boards, wherein a part of the alloy layer is exposed out of the solder paste layer to form a thermal conductive surface, a sealed heat dissipating chamber being formed between two thermal conductive surfaces on two alloy layers of the two wiring base boards; and
    a heat transfer medium located in the heat dissipating chamber, wherein the insulation layer is provided with a first thermal conductive element connecting the first conductor layer and the alloy layer, the first conductor layer, the first thermal conductive element, the alloy layer, and the heat dissipating chamber together form a heat transfer path.

10. The circuit board of claim 9, wherein the alloy layer is one or more of a nickel-chromium alloy layer, a copper-chromium alloy layer, and a copper-aluminum alloy layer.

11. The circuit board of claim 9, wherein the heat dissipating chamber is provided with polytetrafluoroethylene therein.

12. The circuit board of claim 9, wherein each of the two wiring base boards further includes a second conductor and a core layer, the second conductor is disposed on a side of the alloy layer away from the insulation layer, the core layer is disposed around the solder paste layer, the solder paste layer and two thermal conductive surfaces on two alloy layers of the two wiring base boards together form the heat dissipating chamber.

13. The circuit board of claim 12, further comprising at least one second thermal conductive element formed between two first conductor layers of the two wiring base boards, the at least one second thermal conductive element passing through two alloy layers of the two wiring base boards, two second conductor layer of the two wiring base boards, and the core layer.

14. The circuit board of claim 9, further comprising a solder mask layer formed on a surface of the first conductor layer of each of the two wiring base boards.

* * * * *